(12) United States Patent
Strangman

(10) Patent No.: US 6,395,343 B1
(45) Date of Patent: May 28, 2002

(54) DURABLE THERMAL BARRIER COATING

(75) Inventor: Thomas E. Strangman, Phoenix, AZ (US)

(73) Assignee: AlliedSignal, Morristown, NJ (US)

(*) Notice: Subject to any disclaimer, the term of this patent is extended or adjusted under 35 U.S.C. 154(b) by 0 days.

(21) Appl. No.: 08/635,444

(22) Filed: Apr. 19, 1996

Related U.S. Application Data

(62) Division of application No. 08/341,798, filed on Nov. 18, 1994, now Pat. No. 5,562,998.

(51) Int. Cl.⁷ .................................................. B05D 1/36
(52) U.S. Cl. .................... 427/454; 427/566; 427/126.3; 427/248.1; 427/255.11; 427/255.12; 427/255.19; 427/419.3; 427/443.2
(58) Field of Search ............................ 427/126.3, 453, 427/248.1, 566, 443.2, 419.3, 255.12, 255.11, 255.19, 454

(56) References Cited

U.S. PATENT DOCUMENTS

| | | | |
|---|---|---|---|
| 2,927,043 A | 3/1960 | Stetson | 117/63 |
| 3,415,672 A | 12/1968 | Levinstein et al. | 117/71 |
| 3,489,537 A | 1/1970 | Cook | 24/194 |
| 3,849,865 A | 11/1974 | Gedwill et al. | 29/460 |
| 3,869,779 A | 3/1975 | Gedwill et al. | 29/194 |
| 3,940,569 A | 2/1976 | Schonbrun et al. | 179/18 |
| 3,955,935 A | 5/1976 | Shockley et al. | 29/194 |
| 3,978,251 A | 8/1976 | Stetson et al. | 427/229 |
| 3,979,534 A | 9/1976 | Rairden, III | 427/405 |
| 3,996,021 A | 12/1976 | Chang et al. | 29/194 |
| 4,005,989 A | 2/1977 | Preston | 29/194 |
| 4,080,486 A | 3/1978 | Walker et al. | 428/653 |
| 4,321,310 A | 3/1982 | Ulion et al. | 428/612 |
| 4,321,311 A | 3/1982 | Strangman | 428/623 |
| 4,335,190 A | 6/1982 | Bill et al. | 428/623 |
| 4,374,183 A | 2/1983 | Deadmore et al. | 428/641 |
| 4,401,697 A | 8/1983 | Strangman | 427/250 |
| 4,405,659 A | 9/1983 | Strangman | 427/248.1 |
| 4,405,660 A | 9/1983 | Ulion et al. | 427/248.1 |
| 4,414,249 A | 11/1983 | Ulion et al. | 427/248.1 |
| 4,447,503 A | 5/1984 | Dardi et al. | 428/632 |
| 4,676,994 A | 6/1987 | Demaray | 427/42 |
| 4,880,614 A | 11/1989 | Strangman et al. | 428/623 |
| 4,916,022 A | 4/1990 | Solfest et al. | 428/623 |
| 5,015,502 A | 5/1991 | Strangman et al. | 427/248.1 |
| 5,073,433 A | 12/1991 | Taylor | |
| 5,238,752 A | 8/1993 | Duderstadt et al. | 428/623 |
| 5,498,484 A | * 3/1996 | Duderstadt | 428/633 |
| 5,512,382 A | * 4/1996 | Strangman | 428/632 |

FOREIGN PATENT DOCUMENTS

| | | |
|---|---|---|
| EP | 0609795 A1 | 8/1994 |
| GB | 2269392 | 2/1994 |

OTHER PUBLICATIONS

"Corrosion Resistant Sol–Gel ZrO2 Coatings on Stainless Steel", Atik, et al., *Journal of Non–Crystalline Solids*, No. 147/148, pp. 813–819, Oct. 1, 1992.

* cited by examiner

*Primary Examiner*—Katherine A. Bareford
(74) *Attorney, Agent, or Firm*—Robert Desmond, Esq.

(57) ABSTRACT

A thermal barrier coating for superalloy turbine engine vanes and blades that are exposed to high temperature gas is disclosed. The coating includes an aluminide or MCrAlY layer, an alumina layer, and a ceramic top layer. The ceramic layer has a columnar grain microstructure. A bond inhibitor is disposed in the gaps between the columnar grains. This inhibitor is either unstabilized zirconia, unstabilized hafnia, or a mixture thereof.

5 Claims, 1 Drawing Sheet

DURABLE THERMAL BARRIER COATING

This application is a division of application Ser. No. 08/341,798, filed Nov. 18, 1994, now U.S. Pat. No. 5,562,998.

TECHNICAL FIELD

This invention relates generally to thermal barrier coatings for superalloy substrates and in particular to a multilayer, ceramic thermal barrier coating resistant to sintering damage for superalloy blades and vanes in gas turbine engines.

BACKGROUND OF THE INVENTION

As gas turbine engine technology advances and engines are required to be more efficient, gas temperatures within the engine continue to rise. However, the ability to operate at these increasing temperatures is limited by the ability of the superalloy turbine blades and vanes to maintain their mechanical strength when exposed to the heat, oxidation, and corrosive effects of the impinging gas. One approach to this problem has been to apply a protective thermal barrier coating which insulates the blades and vanes and inhibits oxidation and hot gas corrosion.

Typically, the thermal barrier coating will have an outer ceramic layer that has a columnar grained microstructure. Gaps between the individual columns allow the columnar grains to expand and contract without developing stresses that could cause spalling. Strangman, U.S. Pat. Nos. 4,321,311, 4,401,697, and 4,405,659 disclose a thermal barrier coating for a superalloy substrate that contains a MCrAlY layer, an alumina layer, and an outer columnar grained ceramic layer. Duderstadt et al., U.S. Pat. No. 5,238,752 and Strangman U.S. Pat. No. 5,514,482 disclose a thermal barrier coating for a superalloy substrate that contains an aluminide layer, an alumina layer, and an outer columnar grained ceramic layer.

A problem with columnar grained ceramic layers is that when exposed to temperatures over 1100° C. (2012° F.) for substantial periods of time, sintering of the columnar grains occurs. The gaps close as adjacent columnar grains bond together. Once the gaps become closed, the ceramic layer can no longer accommodate the thermal expansion and may spall or crack.

Accordingly there is a need for a thermal barrier coating having a columnar grained ceramic layer that is resistant to the sintering of the grains.

SUMMARY OF THE INVENTION

An object of the present invention is to provide a superalloy article having a thermal barrier coating which includes a ceramic layer that is resistant to sintering when exposed to high temperature gas.

Another object of the present invention is to provide a method of applying a sintering resistant thermal barrier coating to a superalloy substrate.

The present invention achieves these objects by providing a thermal barrier coating for a superalloy substrate that includes an Aluminide or MCrAlY layer, an alumina layer, and a ceramic top layer. The ceramic layer has a columnar grain microstructure. A bond inhibitor is disposed in the gaps between the columnar grains. This inhibitor is either unstabilized zirconia, unstabilized hafnia, or a mixture thereof.

DESCRIPTION OF THE PREFERRED EMBODIMENT

Figure 1:
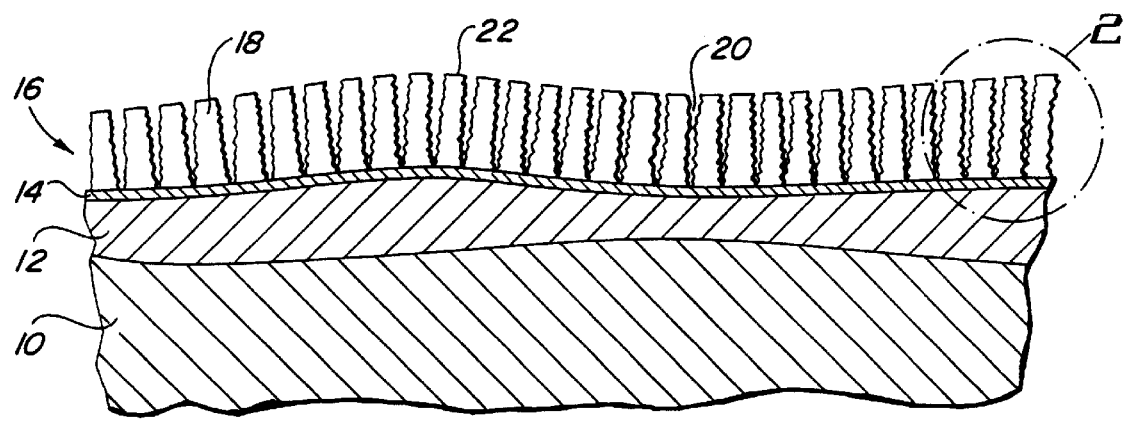
FIG. 1 is a cross sectional schematic of a coated article as contemplated by the present invention.
Figure 2:
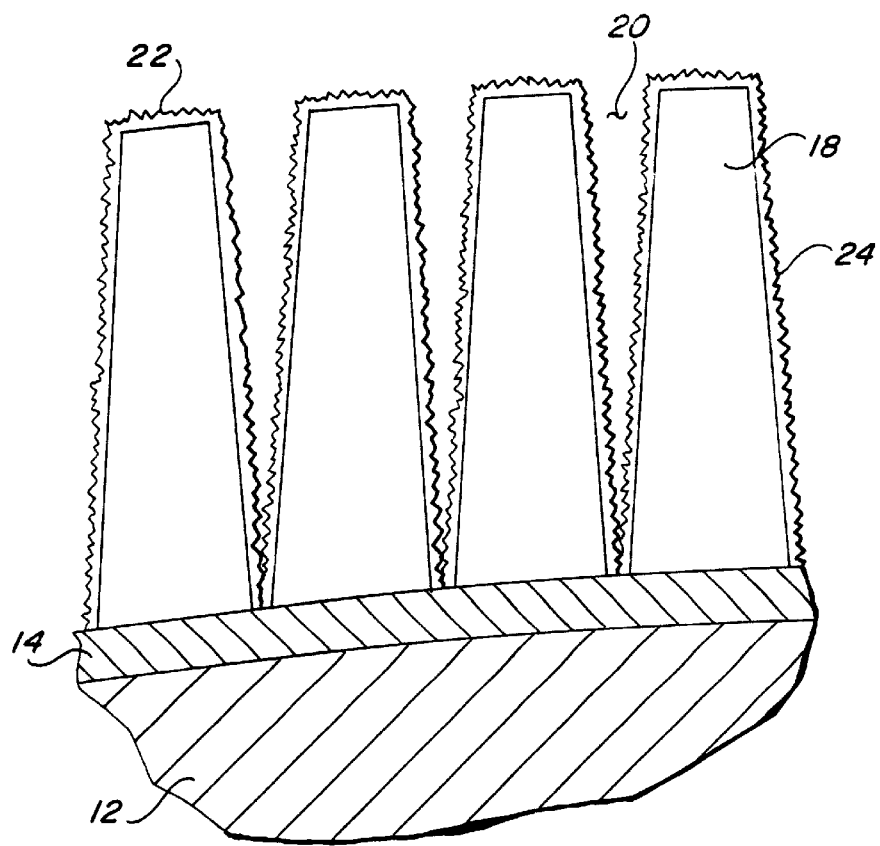
FIG. 2 is an enlargement of a portion of FIG. 1.

Referring to the drawing, a base metal or substrate 10 is a nickel, cobalt or iron based high temperature alloy from which turbine airfoils are commonly made. Preferably, the substrate 10 is a superalloy having hafnium and/or zirconium such as MAR-M247, IN-100 and MAR-M 509, the compositions of which are shown in Table 1.

TABLE 1

| Alloy | Mo | W | Ta | Al | Ti | Cr | Co | Hf | V | Zr | C | B | Ni |
|---|---|---|---|---|---|---|---|---|---|---|---|---|---|
| Mar-M247 | .65 | 10 | 3.3 | 5.5 | 1.05 | 8.4 | 10 | 1.4 | — | .055 | .15 | .15 | bal. |
| IN-100 | 3.0 | — | — | 5.5 | 4.7 | 9.5 | 15.0 |  | 1.0 | .06 | .17 | .015 | bal. |
| Mar-M509 | — | 7.0 | 3.5 | — | 0.25 | 23.4 | Bal. | — | — | .5 | .6 | — | 10.0 |

A bond coat 12 lies over the substrate 10. The bond coat 12 is usually comprised of a MCrAlY alloy. Such alloys have a broad composition of 10 to 35% chromium, 5 to 15% aluminum, 0.01 to 1% yttrium, or hafnium, or lanthanum, with M being the balance. M is selected from a group consisting of iron, cobalt, nickel, and mixtures thereof. Minor amounts of other elements such as Ta or Si nay also be present. These alloys are known in the prior art and are described in U.S. Pat. Nos. 4,880,614; 4,405,659; 4,401,696; and 4,321,311 which are incorporated herein by reference. The MCrAlY bond coat is preferably applied by electron beam vapor deposition though sputtering and low pressure plasma spraying may also be used.

Alternatively, the bond coat 12 can be comprised of an intermetallic aluminide such as nickel aluminide or platinum aluminide. The aluminide bond coat can be applied by standard commercially available aluminide processes whereby aluminum is reacted at the substrate surface to form an Aluminum intermetallic compound which provides a reservoir for the growth of an alumina scale oxidation resistant layer. Thus the aluminide coating is predominately composed of aluminum intermetallic [e.g. NiAl, CoAl, FeAl and (Ni, Co, Fe)Al phases] formed by reacting aluminum vapor species, aluminum rich alloy powder or surface layer with the substrate elements in the outer layer of the superalloy component. This layer is typically well bonded to the substrate. Aluminiding may be accomplished by one of several conventional prior art techniques, such as, the pack cementation process, spraying, chemical vapor deposition, electrophoresis, sputtering, and slurry sintering with an aluminum rich vapor and appropriate diffusion heat treatments. Other beneficial elements can also be incorporated into diffusion aluminide coatings by a variety of processes. Beneficial elements include Pt, Pd, Si, Hf and oxide particles, such as alumina, yttria, hafnia, for enhancement of alumina scale adhesion, Cr and Mn for hot corrosion resistance, Rh, Ta and Cb for diffusional stability and/or oxidation resistance and Ni, Co for increasing ductility or incipient melting limits.

In the specific case of platinum modified diffusion aluminide coating layers, the coating phases adjacent to the alumina scale will be platinum aluminide and/or nickel-platinum aluminide phases (on a Ni-base superalloy). Intermetallic bond coats are known in the prior art and are described in U.S. Pat. Nos. 5,238,752 and 5,514,482 which are incorporated herein by reference.

Through oxidation an alumina or aluminum oxide layer 14 is formed over the bond coat 12. The alumina layer 14 provides both oxidation resistance and a bonding surface for the ceramic layer 16. The alumina layer 14 may be formed before the ceramic layer 16 is applied, during application of layer 16, or subsequently by heating the coated article in an oxygen containing atmosphere at a temperature consistent with the temperature capability of the superalloy, or by exposure to the turbine environment. The sub-micron thick alumina scale will thicken on the aluminide surface by heating the material to normal turbine exposure conditions. The thickness of the alumina scale is preferably sub-micron (up to about one micron).

The ceramic layer 16 is applied by electron beam vapor deposition and as result has a columnar grained microstructure. The columnar grains or columns 18 are oriented substantially perpendicular to the surface of the substrate 10. Between the individual columns 18 are micron sized gaps 20 extending from the outer surface 22 of the ceramic layer 16 toward (within a few microns) of the alumina layer 14. The presence of intercolumnar gaps reduces the effective modulus (increases compliance) of the stabilized zirconia layer in the plane of the coating. Increased compliance provided by the gaps enhances coating durability by eliminating or minimizing stresses associated with thermal gradient and superalloy/zirconia thermal expansion mismatch strains in the stabilized zirconia layer. Alternatively, the ceramic layer 18 can be applied by a plasma spray process. Although this process does not produce a columnar microstructure, it does create an interconnected network of subcritical microcracks with micron-width opening displacements, which reduce the modulus of the stabilized zirconia layer. The network of subcritical microcracks performs the same function as the gaps 20. In this application the term "gap" includes these microcracks.

The ceramic layer 16 may be any of the conventional ceramic compositions used for this purpose. A preferred composition is the yttria stabilized zirconia coating. These zirconia ceramic layers have a thermal conductivity that is about 1 and one-half orders of magnitude lower than that of the typical superalloy substrate such as MAR-M247. Instead of or in addition to the yttria, the zirconia may be stabilized with CaO, MgO, CeO$_2$ as well as Y$_2$O$_3$. Another ceramic believed to be useful as the columnar type coating material within the scope of the present invention is hafnia which can be yttria-stabilized. The particular ceramic material selected should be stable in the high temperature environment of a gas turbine. The thickness of the ceramic layer may vary from 1 to 1000 microns but is typically in the 50 to 300 microns range.

Because of differences in the coefficients of thermal expansion between the substrate 10 and the ceramic layer 16, when heated or cooled, the substrate 10 expands (or contracts) at a greater rate than the ceramic layer 16. The gaps 20 allow the columnar grains 18 to expand and contract without producing stresses that would cause the ceramic layer to spall or crack.

When exposed to temperatures over 1100° C. (2012° F.) for periods of time, sintering of the columnar grains 18 occurs. The gaps 20 close as adjacent columnar grains 18 bond together. With the gaps 20 closed, the ceramic layer 16 is less able to accommodate the thermal expansion mismatch and may spall or crack. Resistance to sintering is imparted to the columnar grains 18 by sheathing them with a submicron layer of bond inhibitor 24. The bond inhibitor 24 is preferably unstabilized zirconia which will cycle through disruptive tetragonal and monoclinic phase transformations every thermal cycle and thereby inhibit bonding of adjacent grains 18. Unstabilized hafnia is another material that may be used as the bond inhibitor 24. It may also significantly increase the temperature required for sintering because its melting temperature is about 200° C. (392° F.) higher than that of zirconia. Pure hafnia also has a monoclinic structure which should bond poorly with the cubic phase of the yttria stabilized zirconia grains 18.

The bond inhibitor 24 is applied by immersing the coated substrate into a zirconia or hafnia sol gel bath. Most of the volume of the sol gel is solvent and evaporates when the substrate is removed from the bath. Consequently, the gaps 20 remain partially open which is necessary for strain accommodation. Partial chemical vapor infiltration is another method that can be used to apply the bond inhibitor 24. Partial chemical vapor infiltration is a conventional chemical vapor deposition process where the process is halted before densification (i.e, before the deposited substance fills the gaps between columnar grains).

Various modifications and alterations to the above described preferred embodiment will be apparent to those skilled in the art. Accordingly, this description of the invention should be considered exemplary and not as limiting the scope and spirit of the invention as set forth in the following claims.

What is claimed is:

1. A method for producing a superalloy article having a ceramic thermal barrier coating thereon, comprising the steps of:

(a) providing a superalloy substrate with a clean surface;

(b) applying a bond coat to at least a portion of the clean superalloy substrate surface;

(c) applying a ceramic coat over said bond coat so that a plurality of micron sized gaps form in the ceramic coat;

(d) immersing the coated substrate in a sol gel bath of a bond inhibitor selected from the group consisting of unstabilized zirconia, unstabilized hafnia, and mixtures thereof; and (e) removing the coated substrate from the sol gel bath.

2. The method of claim 1 wherein step (c) is electron beam vapor deposition.

3. The method of claim 1 wherein step (c) is plasma spraying.

4. The method of claim 1 further comprising the step of drying the coated substrate in air after it has been removed from the sol gel bath.

5. A method for producing a superalloy article having a ceramic thermal barrier coating thereon, comprising the steps of:

(a) providing a superalloy substrate with a clean surface;

(b) applying a bond coat to at least a portion of the clean superalloy substrate surface;

(c) applying a ceramic coat over said bond coat so that a plurality of micron sized gaps form in the ceramic coat;

(d) applying a bond inhibitor selected from the group consisting of unstabilized zirconia, unstabilized hafnia, and mixtures thereof to the ceramic coat by partial chemical vapor infiltration.

* * * * *

UNITED STATES PATENT AND TRADEMARK OFFICE
CERTIFICATE OF CORRECTION

PATENT NO.   : 6,395,343 B1
DATED        : May 28, 2002
INVENTOR(S)  : Thomas E. Strangman It is certified that error appears in the above-identified patent and that said Letters Patent is hereby corrected as shown below:

<u>Title page,</u>
Item [*], Notice, delete "0" and insert -- 1352 --.

Signed and Sealed this

Twenty-third Day of March, 2004

JON W. DUDAS
*Acting Director of the United States Patent and Trademark Office*